United States Patent [19]

Takeuchi

[11] Patent Number: 5,641,696
[45] Date of Patent: Jun. 24, 1997

[54] METHOD OF FORMING DIFFUSION LAYER AND METHOD OF MANUFACTURING NONVOLATILE SEMICONDUCTOR MEMORY DEVICE

[75] Inventor: Nobuyoshi Takeuchi, Tokyo, Japan

[73] Assignee: NKK Corporation, Japan

[21] Appl. No.: 519,812

[22] Filed: Aug. 25, 1995

[30] Foreign Application Priority Data

Aug. 31, 1994 [JP] Japan .................................. 6-229088

[51] Int. Cl.$^6$ .............................................. H01L 21/8247
[52] U.S. Cl. ........................ 438/257; 438/305; 438/264
[58] Field of Search ................................ 437/30, 43, 44, 437/162

[56] References Cited

U.S. PATENT DOCUMENTS

| | | | |
|---|---|---|---|
| 4,780,424 | 10/1988 | Holler et al. | 437/30 |
| 4,804,637 | 2/1989 | Smayling et al. | 437/43 |
| 4,849,369 | 7/1989 | Jeuch et al. | 437/43 |
| 4,978,626 | 12/1990 | Poon et al. | 437/44 |
| 4,978,629 | 12/1990 | Komori et al. | 437/162 |
| 5,098,855 | 3/1992 | Komori et al. | 437/44 |
| 5,426,063 | 6/1995 | Kaneko et al. | 437/30 |
| 5,491,099 | 2/1996 | Hsu | 437/44 |

FOREIGN PATENT DOCUMENTS

| | | |
|---|---|---|
| 2-2686 | 1/1990 | Japan . |
| 2-206177 | 8/1990 | Japan . |
| 3-205878 | 9/1991 | Japan . |
| 4-211178 | 8/1992 | Japan . |
| 5-21811 | 1/1993 | Japan . |
| 166832 | 7/1993 | Japan . |
| 5-218451 | 8/1993 | Japan . |
| 6-237002 | 8/1994 | Japan . |
| 193200 | 7/1995 | Japan . |

Primary Examiner—Chandra Chaudhari
Attorney, Agent, or Firm—Nixon & Vanderhye

[57] ABSTRACT

The first impurity species having a low diffusion rate is heavily doped in a predetermined region of a semiconductor substrate in contact with portions corresponding to the edges of a floating gate, and the second impurity species having a low diffusion rate is lightly doped in the predetermined region from a position separated from the portions corresponding to the edges of the floating gate by a predetermined distance. Annealing is performed such that the second impurity species is diffused below the floating gate more inward than the first impurity species, and part of a diffusion region formed by the first impurity species serves as a tunnel region which overlaps the floating gate. With this structure, a short channel effect can be prevented, and an inter-band current can be suppressed.

11 Claims, 9 Drawing Sheets

METHOD OF FORMING DIFFUSION LAYER AND METHOD OF MANUFACTURING NONVOLATILE SEMICONDUCTOR MEMORY DEVICE

BACKGROUND OF THE INVENTION

1. Field of the Invention

The present invention relates to a method of forming a diffusion layer and a method of manufacturing a nonvolatile semiconductor memory device.

2. Description of the Related Art

FIG. 1 is a sectional view for generally explaining a Depletion layer formation at the edge of a gate which bias applies to both Gate and Drain. First, when a negative voltage $V_G$ is to be applied to a floating gate 52, and a positive voltage $V_D$ is to be applied to a drain region 59 to extract electrical charges from the floating gate 52 to the drain region, a depletion region 59a indicated by dotted lines is produced in an $n^+$-type diffusion layer, as shown in FIG. 1. An effective electric field between the floating gate 52 and the drain region 59 is weakened due to this depletion layer, decreasing an F-N tunnel current. Therefore, an F-N tunnel type memory requires an overlapping region between a heavily doped $n^+$-type diffusion layer and a floating gate of a polysilicon film where it is difficult to produce a depletion layer or the depletion layer is very small even if it is produced, i.e., a tunnel window for allowing an F-N tunnel current to flow. On the other hand, a band to band tunnel current flows through the $n^+$-type region of the drain edge on the $n^+$-p junction portion in the p-type semiconductor substrate 50 due to band bend caused by application of the voltages $V_G$ and $V_D$. That is, an electric field is extremely strengthened in an interface region 59a near an oxide film, and band to band tunneling current flows. Due to this, hot holes etc. are generated and the holes are injected to the tunnel oxide film. This decreases the element reliability and degrades the element characteristics soon. Therefore, a technique of smoothing the concentration gradient at a junction edge, easily bending the band of a diffusion layer, and suppressing a band to band tunnel current is required. For this purpose, the DDD structure is formed in which the concentration of the drain edge of a memory cell is low.

FIG. 2 is a sectional view illustrating the structure of a floating gate type nonvolatile semiconductor memory cell having a conventional DDD structure. The common source type memory cell is of 2-poly type memory cell, in which electrical charges are extracted from a floating gate 112 to a common source portion 120, 119b. To suppress an interband tunnel current, after the drain portion 119a is formed as an $n^+$-type diffusion region, phosphorus (P) as an $n^-$-type ion and arsenic (As) as an $n^+$-type ion are simultaneously implanted into a p-type semiconductor substrate 110. Thereafter, an $n^+$-type diffusion region 119b and an $n^-$-type diffusion region 120 are formed by subsequent annealing using a difference between the diffusion rate of phosphorus (P) and that of arsenic (As), realizing the common source regions of the DDD structure. Reference numerals 110a denote channel regions; 111, first gate insulating films; 117, field oxide films for providing an element isolation region; 121, second gate insulating films; and 122, a control gate.

FIGS. 3A to 3C are schematic sectional views for explaining a method of manufacturing a floating gate type nonvolatile semiconductor memory cell having a conventional 1-poly type LDD (Lightly Doped Drain) structure. Generally, as shown in FIG. 3A, after a first gate insulating film 111 is formed on a p-type semiconductor substrate 110, a polysilicon film is deposited and etched to form a gate 112. Thereafter, $n^-$-type ions are implanted into the p-type semiconductor substrate 110 via the first gate insulating film 111 by self-alignment using the gate 112 as a mask. Next, as shown in FIG. 3B, an oxide film is deposited and etched to form spacers 115. $n^+$-type ions are implanted into the p-type semiconductor substrate 110 using the gate 112 and the spacers 115 as masks. As shown in FIG. 3C, annealing is performed to form $n^+$-type diffusion regions 119 and $n^-$-type diffusion regions 120, which constitute an LDD structure.

The current memory cell, however, is required for micropatterning. In the memory cell having the conventional DDD structure in FIG. 2, after the polysilicon film is etched to form the floating gate 112, phosphorus (P) and arsenic (As) are simultaneously ion-implanted and annealed. In diffusing arsenic (As) by this annealing, phosphorus (P) is excessively diffused into the channel region, causing a short channel. For this reason, the conventional method is not suitable for micropatterning a memory cell.

According to the conventional general LDD formation method, for example, as shown in FIG. 3C, the $n^+$-type diffusion regions 119 reach only the end portions of the floating gate 112 consisting of the polysilicon film. The overlap between the floating gate 12 and the $n^+$-type diffusion regions 119 is not sufficient to operate the memory cell with a Fowler-Nordheim (to be referred to as F-N hereinafter) tunnel current. For this reason, movement of electrical charges between the source region and the floating gate is delayed, and the write/read/erase functions of the memory cell are degraded in an early stage.

SUMMARY OF THE INVENTION

The present invention has been made to solve the above problems, and has as its object to provide a method of forming a diffusion layer and a method of manufacturing a nonvolatile semiconductor memory device, in which a short channel effect can be suppressed, an F-N tunnel region can be ensured, and a band to band tunnel current can be suppressed.

A method of forming a diffusion layer according to the present invention comprises the steps of: forming an insulating film having a tunnel effect on a surface of a semiconductor substrate of a first conductivity type; forming a polysilicon film on the insulating film; etching the polysilicon film to form a floating gate on a channel region of the semiconductor substrate; implanting a first impurity species of a second conductivity type having a predetermined diffusion rate at a first concentration at a first predetermined position, adjacent to the floating gate, of the semiconductor substrate in predetermined regions where source and drain regions of the semiconductor substrate are to be formed; implanting a second impurity species of the second conductivity type having a diffusion rate higher than the diffusion rate of the first species at a second concentration lower than the first concentration at a second predetermined position, separated from the first predetermined position by a predetermined distance, of the semiconductor substrate in the predetermined regions where the source and drain regions of the semiconductor substrate are to be formed; and forming a diffusion region of the second conductivity type by annealing such that the second impurity species having the high diffusion rate is diffused below the floating gate more inward than the first impurity species having the low diffusion rate, and part of the diffusion region formed by the first impurity species serves as a tunnel region which overlaps the floating gate via the first insulating film.

A method of manufacturing a nonvolatile semiconductor memory device according to the present invention comprises the steps of: forming a first insulating film having a tunnel effect on a surface of a semiconductor substrate of a first conductivity type; forming a first polysilicon film on the first insulating film; etching the first polysilicon film to form a floating gate on a channel region of the semiconductor substrate; implanting, at a first concentration, a first impurity species of a second conductivity type having a predetermined diffusion rate into the semiconductor substrate in predetermined regions, where source and drain regions of the semiconductor substrate are to be formed, in contact with a portion corresponding to an edge of the floating gate; implanting, at a second concentration lower than the first concentration, a second impurity species of the second conductivity type having a diffusion rate higher than the diffusion rate of the first species into the semiconductor substrate in the predetermined regions where the source and drain regions of the semiconductor substrate are to be formed, separated from the portion corresponding to the edge of the floating gate by a predetermined distance; forming a diffusion region of the second conductivity type by annealing such that the second impurity species having the high diffusion rate is diffused below the floating gate more inward than the first impurity species having the low diffusion rate, and part of the diffusion region formed by the first impurity species serves as a tunnel region which overlaps the floating gate via the first insulating film; forming a second insulating film on an entire surface; forming a second polysilicon film on a surface of the second insulating film; and etching the second insulating film and the first and second polysilicon films to form a nonvolatile memory cell.

A method of manufacturing a nonvolatile semiconductor memory device according to the present invention comprises the steps of: forming a first insulating film having a tunnel effect on a surface of a semiconductor substrate of a first conductivity type; forming a first polysilicon film on the first insulating film; etching the first polysilicon film to form a floating gate on a channel region of the semiconductor substrate; implanting, by self-alignment using the floating gate as a mask at a first concentration, a first impurity species of a second conductivity type having a predetermined diffusion rate into the semiconductor substrate in predetermined regions where source and drain regions of the semiconductor substrate are to be formed; implanting, at a second concentration lower than the first concentration, a second impurity species of the second conductivity type having a diffusion rate higher than the diffusion rate of the first species into the semiconductor substrate in the predetermined regions, where the source and drain regions of the semiconductor substrate are to be formed, separated from a portion corresponding to an edge of the floating gate by a predetermined distance; forming a diffusion region of the second conductivity type by annealing such that the second impurity species having the high diffusion rate is diffused below the floating gate more inward than the first impurity species having the low diffusion rate, and part of the diffusion region formed by the first impurity species serves as a tunnel region which overlaps the floating gate via the first insulating film; forming a second insulating film on an entire surface; forming a second polysilicon film on a surface of the second insulating film; and etching the second insulating film and the first and second polysilicon film to form a nonvolatile memory cell.

A method of manufacturing a nonvolatile semiconductor memory device according to the present invention comprises the steps of: forming an insulating film having a tunnel effect on a surface of a semiconductor substrate of a first conductivity type; forming stacked polysilicon films on the insulating film; etching the stacked polysilicon films to form a floating gate on a channel region of the semiconductor substrate and a control gate on a coupling region of the semiconductor substrate such that the floating gate and the control gate are electrically connected; implanting, by self-alignment using the floating gate and the control gate as masks at a first concentration, a first impurity species of a second conductivity type having a predetermined diffusion rate into the semiconductor substrate in predetermined regions where source and drain regions of the semiconductor substrate are to be formed; implanting, at a second concentration lower than the first concentration, a second impurity species of the second conductivity type having a diffusion rate higher than the diffusion rate of the first species into the semiconductor substrate in the predetermined regions where the source and drain regions of the semiconductor substrate are to be formed, separated from a portion corresponding to an edge of the floating gate by a predetermined distance; and forming a diffusion region of the second conductivity type by annealing such that the second impurity species having the high diffusion rate is diffused below the floating gate more inward than the first impurity species having the low diffusion rate, and part of the diffusion region formed by the first impurity species serves as a tunnel region which overlaps the floating gate via the insulating film.

A method of manufacturing a nonvolatile semiconductor memory device according to the present invention comprises the steps of: forming an oxide film on a surface of a semiconductor substrate of a first conductivity type; etching the oxide film to form an oxide film region in a floating gate formation region on a channel region of the semiconductor substrate; forming a first polysilicon film having a predetermined thickness on an entire surface including source and drain regions and the oxide film region of the semiconductor substrate; implanting, at a first concentration, a first impurity species of a second conductivity type having a predetermined diffusion rate in predetermined regions where the source and drain regions of the first polysilicon film; performing first annealing such that the first impurity species of the second conductivity type is diffused from the first polysilicon film into the source and drain regions, and part of a first diffusion region formed by the first impurity species overlaps the oxide film region; implanting, to a predetermined depth at a second concentration lower than the first concentration, a second impurity species of the second conductivity type having a diffusion rate higher than the diffusion rate of the first impurity species into the first polysilicon film in predetermined region where the source and drain regions of the semiconductor substrate; etching back the first polysilicon film to expose a surface of the oxide film region; removing the oxide film region by etching; performing second annealing such that a device isolation field oxide film is formed on the first polysilicon film in the source and drain regions, at the same time a first insulating film having a tunnel effect is formed on the semiconductor substrate, and the second impurity species having the high diffusion rate is diffused in the semiconductor substrate below the floating gate formation region more inward than the first impurity species having the low diffusion rate; forming a second polysilicon film on an entire surface; etching the second polysilicon film to form a floating gate in the channel region of the semiconductor substrate and a predetermined region of the field oxide film; forming a second insulating film on an entire surface; forming a third polysilicon film on a surface of the second insulating film; and etching the second insulating film and the first, second and third polysilicon films to form a nonvolatile memory cell.

A method of manufacturing a nonvolatile semiconductor memory device according to the present invention comprises the steps of: forming a first insulating film having a tunnel effect on a surface of a semiconductor substrate of a first conductivity type; forming a first polysilicon film on the first insulating film; etching the first polysilicon film to form a floating gate on a channel region of the semiconductor substrate; implanting, by self-alignment using the floating gate as a mask at a first concentration, a first impurity species of a second conductivity type having a predetermined diffusion rate into the semiconductor substrate in predetermined regions where source and drain regions of the semiconductor substrate are to be formed; performing first annealing such that part of a first diffusion region formed by diffusing the first impurity species of the second conductivity type into a region below the floating gate overlaps the floating gate via the first insulating film to serve as a tunnel region, and a side oxide film having a predetermined thickness is formed on a side surface of the floating gate; implanting, by self-alignment using the floating gate and the side oxide film at a second concentration lower than the first concentration, a second impurity species of the second conductivity type having a diffusion rate higher than the diffusion rate of the first species into the semiconductor substrate in the predetermined regions where the source and drain regions of the semiconductor substrate are to be formed; performing second annealing such that part of a second diffusion region formed by diffusing the second impurity species having the high diffusion rate more inward than the first impurity species having the low diffusion rate forms an overlapping portion with the floating gate via the first insulating film; forming a second insulating film on an entire surface; forming a second polysilicon film on a surface of the second insulating film; and etching the second insulating film and the first and second polysilicon film to form a nonvolatile memory cell.

A floating gate type nonvolatile semiconductor memory cell according to the present invention comprises: a semiconductor substrate of a first conductivity type; floating gate electrodes, formed on the semiconductor substrate via a first insulating film, for charging or discharging electrical charges from or to drain regions via the first insulating film having a tunnel effect; source regions of a second conductivity type arranged parallel to and separated from each other on a surface of the semiconductor substrate at a predetermined interval, each of the source regions formed of a diffusion layer constituted by diffusing a high-concentration impurity species of the second conductivity type and a low-concentration impurity species of the second conductivity type and having an inclined junction of the high-concentration impurity and the low-concentration impurity species; drain regions of the second conductivity type interspersed along the source regions on the surface of the semiconductor substrate and formed separated from the source regions via channel regions, each of the drain regions being constituted by diffusing a high-concentration impurity species of the second conductivity type and a low-concentration impurity species of the second conductivity type, having an overlapping portion between the floating gate electrode and a diffusion layer of the high-concentration impurity species as a tunnel region, and having an inclined junction of the high-concentration impurity species and the low-concentration impurity species; and control gate electrodes formed on the floating gate electrodes via a second insulating film and extending perpendicular to the source regions.

A floating gate type nonvolatile semiconductor memory array according to the present invention comprises: a semiconductor substrate of a first conductivity type; a group of memory cells arranged in a matrix form, each memory cell including floating gate electrodes, formed on the semiconductor substrate via a first insulating film, for charging or discharging electrical charges from or to drain regions via a first insulating film having a tunnel effect, source regions of a second conductivity type arranged parallel to and separated from each other on a surface of the semiconductor substrate at a predetermined interval, each of the source regions consisting of a diffusion layer constituted by diffusing a high-concentration impurity species of the second conductivity type and a low-concentration impurity species of the second conductivity type and having an inclined junction of the high-concentration impurity and the low-concentration impurity species, and drain regions of the second conductivity type interspersed along the source regions on the surface of the semiconductor substrate and formed separated from the source regions via channel regions, each of the drain regions being constituted by diffusing a high-concentration impurity species of the second conductivity type and a low-concentration impurity species of the second conductivity type, having an overlapping portion between the floating gate electrode and a diffusion layer of the high-concentration impurity species as a tunnel region, and having an inclined junction of the high-concentration impurity species and the low-concentration impurity species; word lines each constituted by a control gate electrode formed on the floating gate electrodes via a second insulating film; and bit lines connected to the source regions and the drain regions of the memory cells.

Moreover, in the preferred embodiments of the present invention, the first impurity species of the second conductivity type is an arsenic, and the second impurity species of the second conductivity type is phosphorus. The method of the present invention further comprises the steps of: forming the third insulating film formed of a high temperature oxide film (HTO) on the entire surface after the first impurity species of the second conductivity type having a low diffusion rate is implanted; and etching the third insulating film to form a spacer having a predetermined shape on the side surface of the floating gate. The method further comprises the steps of: forming the second insulating film formed of a high temperature oxide film (HTO) on the entire surface after the first polysilicon film is formed; and etching the second insulating film to form spacers having a predetermined shape at the first polysilicon film on the source and drain regions, in which the second impurity species of the second conducive type is implanted, to a predetermined depth, in the first polysilicon film between the spacers within predetermined regions where the source and drain regions are to be formed, and the spacers are etched and removed together with the oxide film region. The method further comprises the steps of: forming the second insulating film formed of a high temperature oxide film (HTO) on the entire surface after the first annealing; and etching the second insulating film to form spacers having a predetermined shape on the side surfaces of the oxide film in the source and drain regions, in which the first polysilicon film is formed on the source and drain regions, the spacers, and the oxide film region, the second impurity species of the second conductivity type is implanted, to a predetermined depth, in the first polysilicon film within predetermined regions where the source and drain regions of the semiconductor substrate are to be formed, and the spacers are etched and removed together with the oxide film region. The device isolation field oxide film is formed to have a predetermined thickness by the second annealing. In the floating gate type nonvolatile semiconductor memory cell, the impurity concentration is $10^{19}$ to $10^{21}$ cm$^{-3}$ on the substrate surface of the tunnel region, and the concentration of the low-concentration impurity species is lower than $5\times10^{19}$ cm$^{-3}$ at the edges of a diffusion region. The impurity concentration is $10^{20}$ to $10^{21}$ cm$^{-3}$ on the substrate surface of the tunnel region, and the concentration of the low-concentration impurity species is lower than $5\times10^{18}$ cm$^{-3}$.

According to the present invention, a floating gate forming of a polysilicon film is formed on a p-type semiconductor substrate via a first insulating film in forming a floating gate type nonvolatile semiconductor memory cell. In order to form a tunnel region in the drain region, arsenic (As) as an n$^+$-type impurity is ion-implanted using the floating gate as a mask. Next, spacers are formed on the two side surfaces of the floating gate. Phosphorus (P) as an n$^-$-type impurity for suppressing an inter-band tunnel current is ion-implanted into the drain region by self-alignment using the floating gate and the spacers as masks. N$^+$-type impurities and n$^-$-type impurities are diffused by annealing. In the present invention, the tunnel region can be ensured by diffusing arsenic (As) of an n$^-$-type impurity, ion implantation is performed using the spacers even if the diffusion rate of phosphorus (P) as an n$^-$-type impurity is higher than that of arsenic (As) as an n$^+$-type impurity, and diffusion is started from a position away from the edges of the floating gate to the channel region. Therefore, there is provided the floating gate type nonvolatile semiconductor memory cell having the DDD structure in which a short channel can be prevented, and at the same time a band to band tunnel current can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The preferred embodiments of the present invention will be described below with reference to the accompanying drawings.

First Embodiment

Figure 1:
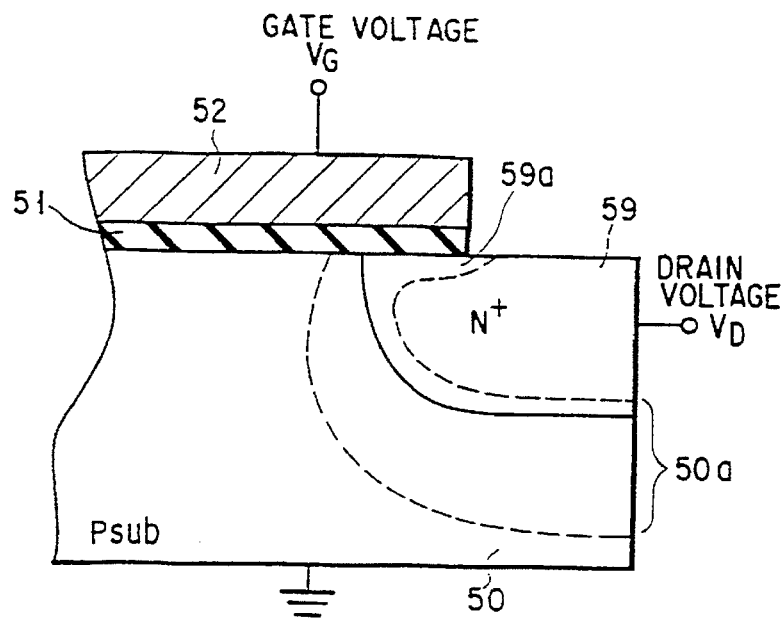
FIG. 1 is a sectional view for generally explaining a depletion layer formation when bias applies to Gate and Drain.
Figure 2:
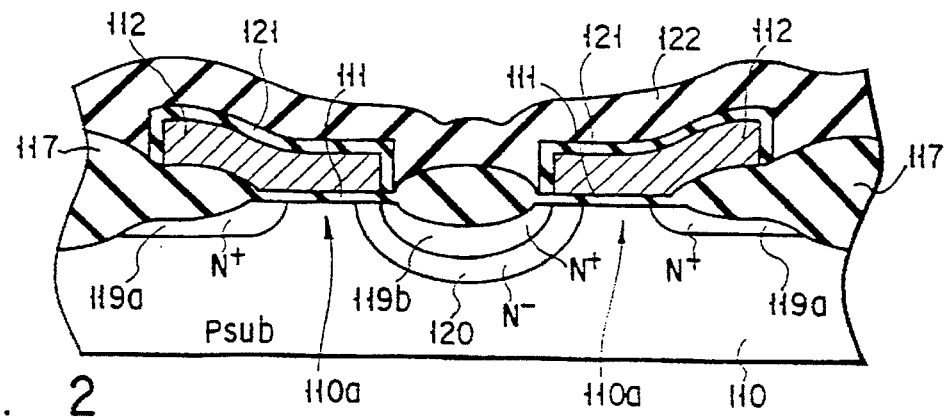
FIG. 2 is a sectional view illustrating the structure of a floating gate type nonvolatile semiconductor memory cell having a conventional DDD structure.
Figure 3A:
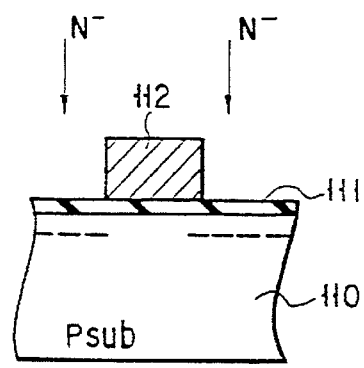
FIGS. 3A to 3C are schematic sectional views for explaining a method of manufacturing a floating gate type nonvolatile semiconductor memory cell having a conventional 1-poly type DDD structure.
Figure 3B:
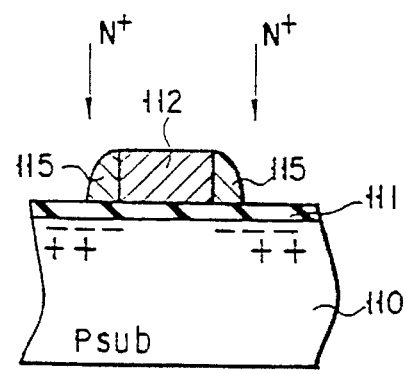
Figure 3C:
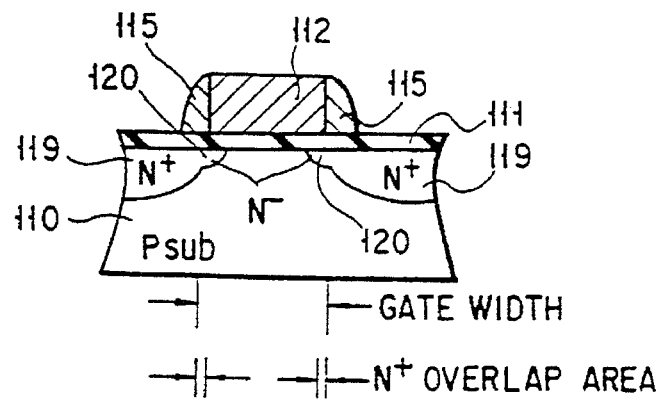
Figure 4A:
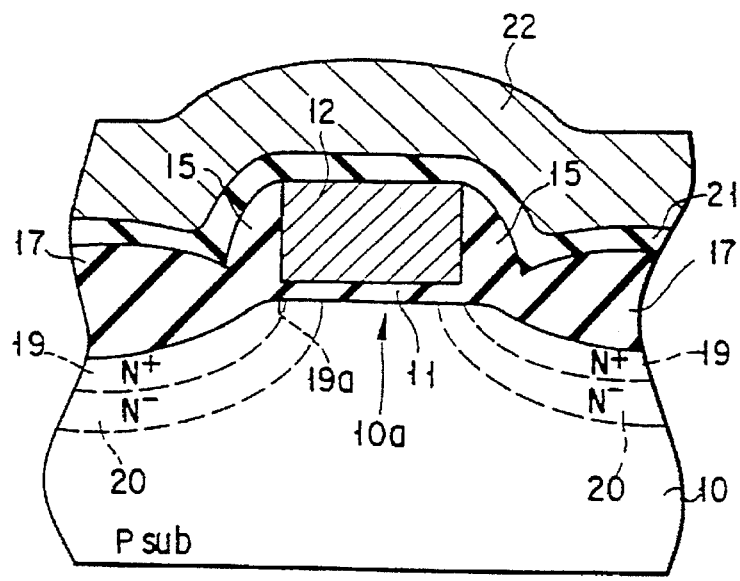
FIGS. 4A and 4B are a sectional view and a plan view schematically showing the arrangement of a floating gate type nonvolatile semiconductor memory cell according to the first embodiment of the present invention, respectively.
Figure 4B:
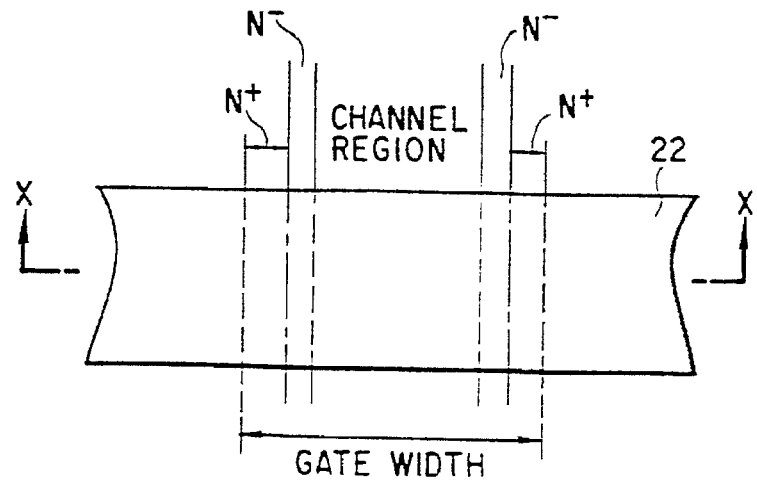

FIGS. 4A and 4B are a sectional view and a plan view schematically showing the structure of a floating gate type nonvolatile semiconductor memory cell according to the first embodiment of the present invention, respectively. The first embodiment exemplifies channel erase and drain program operations by using an F-N current. Referring to FIG. 4A, a floating gate electrode 12 is formed on a p-type (first conductivity type) semiconductor substrate 10 via a first insulating film 11 having a tunnel effect. The floating gate electrodes 12 charge or discharge electrical charges from or to drain regions, source regions and channel regions. Spacers 15 as side walls are formed on both the side surfaces of the floating gate electrode 12. N-type (second conductivity type) source regions are arranged parallel to each other on the surface of the semiconductor substrate 10 at a predetermined interval. Each n-type source region is formed of a diffusion layer having the inclined junction of an $n^+$-type diffusion region 19 of a n-type high-concentration impurity species and an $n^-$-type diffusion region 20 of a low-concentration impurity species. N-type drain regions are interspersed along the source regions on the surface of the p-type semiconductor substrate 10. Each n-type drain region is formed separated from the surface region via a channel region 10a. The drain region is formed of the $n^+$-type diffusion region 19 of the n-type high-concentration impurity species and the $n^-$-type diffusion region 20 of the low-concentration impurity species. The drain region has an overlapping portion between the floating gate electrode 12 and the $n^+$-type diffusion region 19 of the high-concentration impurity species as a tunnel region 19a, and the inclined junction of the $n^+$-type diffusion region 19 of the high-concentration impurity species and the $n^-$-type diffusion region 20 of the low-concentration impurity species. Memory cells are separated by field oxide films 17. A control gate electrodes 22 are formed on the floating gate electrodes 12 via a second insulating film 21 formed of an ONO film (to be described later). As shown in FIG. 4B, the control gate electrode 22 acts as a word line WL extending perpendicular to the source region. The floating gate electrode 12 overlaps the $n^+$-type diffusion region 19 and the $n^-$-type diffusion region 20, as shown in FIG. 4B.

Figure 5A:
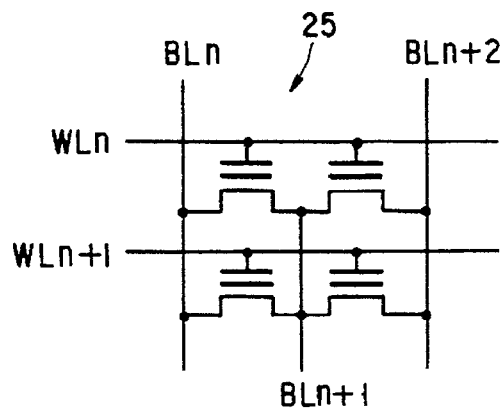
FIGS. 5A and 5B are a sectional view and a plan view schematically showing the arrangement of a floating gate type nonvolatile semiconductor memory cell array according to the present invention, respectively.
Figure 5B:
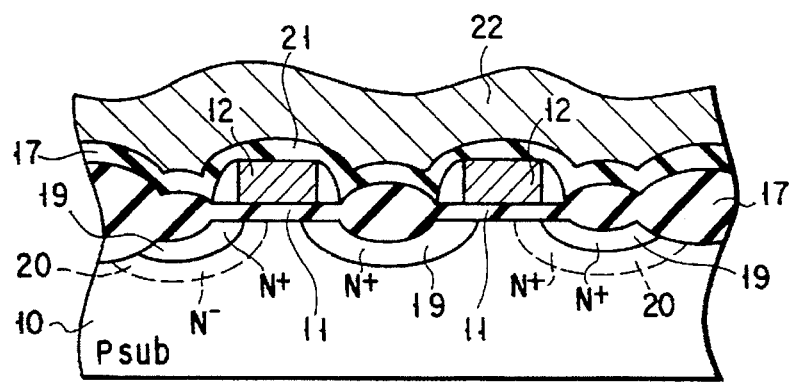

FIGS. 5A and 5B are a plan view and a sectional view schematically showing an arrangement of a floating gate type nonvolatile semiconductor memory cell array according to the present invention, respectively. A group of common source type memory cells 25 are aligned on the semiconductor substrate in a matrix form. The control gate electrode 22 acts as the word line WL. Bit lines BL are connected to the drain regions of respective memory cells and the common sources of plurality of memory cells via contact hole. Note that the bit lines BL may be connect to the drain region in the other fashions.

Figure 6A:
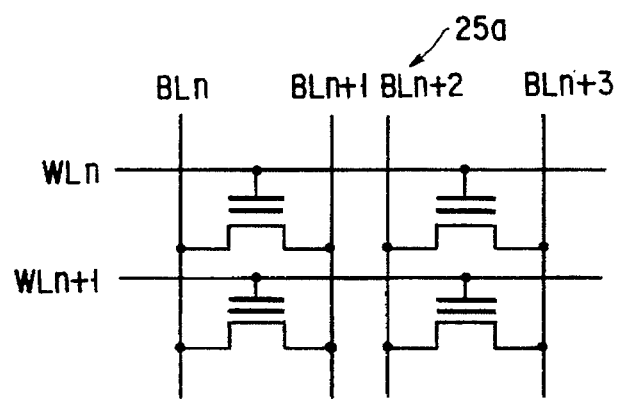
FIGS. 6A and 6B are a sectional view and a plan view schematically showing another arrangement of a floating gate type nonvolatile semiconductor memory cell array according to the present invention, respectively.
Figure 6B:
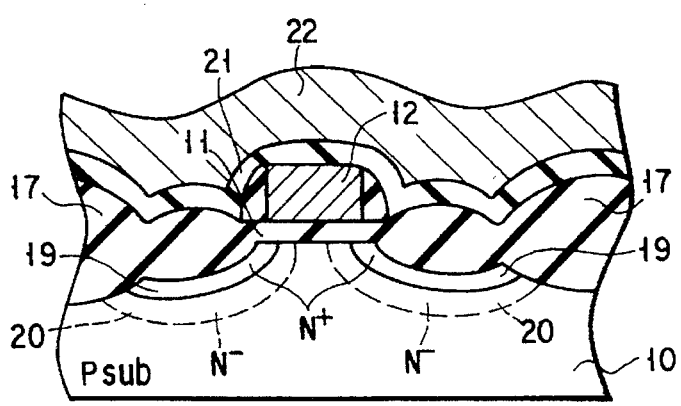

FIGS. 6A and 6B are a plan view and a sectional view schematically showing another arrangement of a floating gate type nonvolatile semiconductor memory cell array according to the present invention, respectively. A group of memory cells 25 are aligned on the substrate in a matrix form. The control gate electrode 22 acts as the word line WL. The bit lines BL are connected to both the drain regions and the source regions of respective memory cells.

Figure 7A:
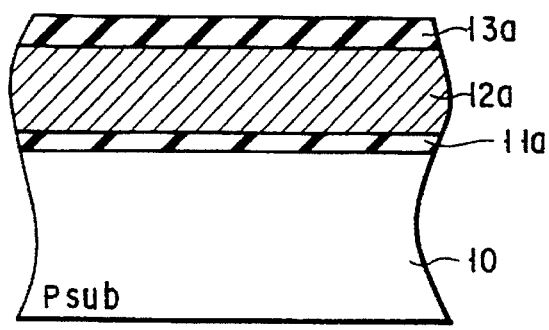
FIGS. 7A to 7C are sectional views for explaining the manufacturing process of the floating gate type nonvolatile semiconductor memory cell according to the first embodiment of the present invention.
Figure 7B:
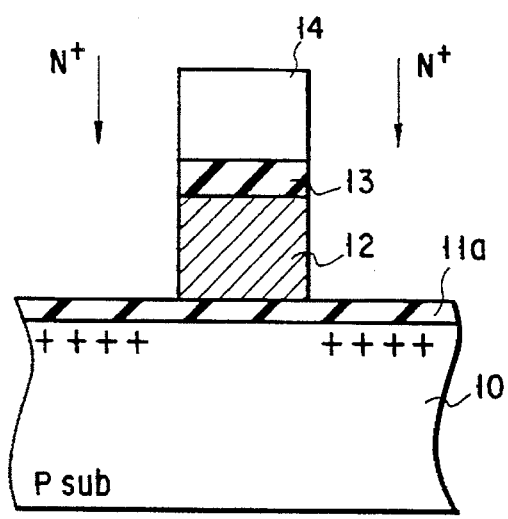
Figure 7C:
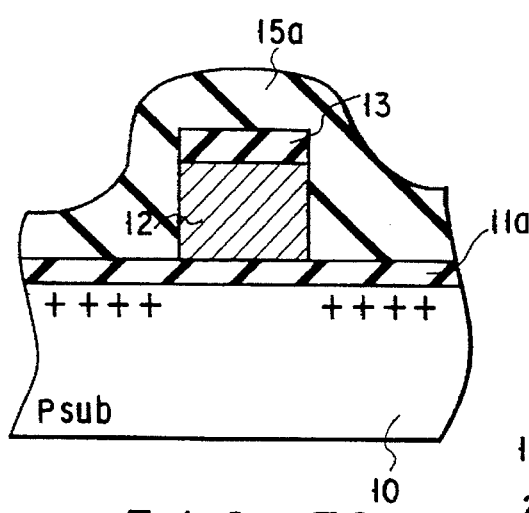

A method of manufacturing the floating gate type nonvolatile semiconductor memory cell according to the first embodiment of the present invention will be described hereinafter with reference to FIGS. 7A to 7C, FIGS. 8A to 8C, and FIG. 9. As shown in FIG. 7A, a 9-nm thick tunnel oxide film 11a as the first insulating film having a tunnel effect is formed on the surface of the p-type semiconductor substrate 10 in an oxidation step at a temperature of 800° C. with $O_2$ and HCl at the condition of HCl/$O_2$+HCl=4.2 wt %, and annealing step in an $O_2/N_2$ gas mixture atmosphere at a temperature of 900° C. A first polysilicon film 12a, which finally becomes the floating gate 12, is deposited to 150 nm on the tunnel oxide film 11a by the low-pressure chemical vapor deposition method (LPCVD) in an $SiH_4$ gas atmosphere at a temperature of 630° C. Phosphorus (P) is doped in the polysilicon film 12a at an acceleration voltage of 30 keV and $7\times10^{14}/cm^2$, and then the polysilicon film 12a is annealed and activated in an $N_2$ gas at a temperature of 900° C. Next, to protect the surface of the floating gate electrode during the process, a nitride (SiN) film 13a is deposited to a thickness of 60 nm on the entire surface of the polysilicon film 12a by the LPCVD in an $NH_3/SiH_4$ gas atmosphere at a temperature of 790° C. As shown in FIG. 7B, the resultant structure is patterned by the photoetching method (photo step) using a photoresist 14. By reactive ion etching (RIE), the nitride film 13a is etched using a $CHF_3$ gas, and the polysilicon film 12a is etched using an $HBr/Cl_2$ gas to form the floating gate 12. Arsenic (As) of an $n^+$-type ion as the first impurity species having a predetermined lower diffusion rate is ion-implanted in predetermined regions of the semiconductor substrate 10, where the source and drain regions of the semiconductor substrate are to be formed, by self-alignment using the floating gate 12 as a mask at an acceleration voltage 60 kev and $3\times10^{15}/cm^2$. As shown in FIG. 7C, a high temperature oxide (HTO) film 15a is deposited to a thickness of 150 nm on the entire surface by the LPCVD in an $N_2O/SiH_4$ gas atmosphere at a temperature of 800° C. The HTO film 15a is almost a thermal oxide film and has a good film quality.

Figure 8A:
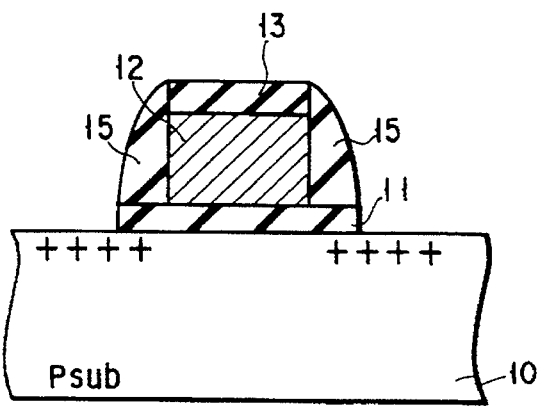
FIGS. 8A to 8C are sectional views for explaining the manufacturing process of the floating gate type nonvolatile semiconductor memory cell according to the first embodiment of the present invention.
Figure 8B:
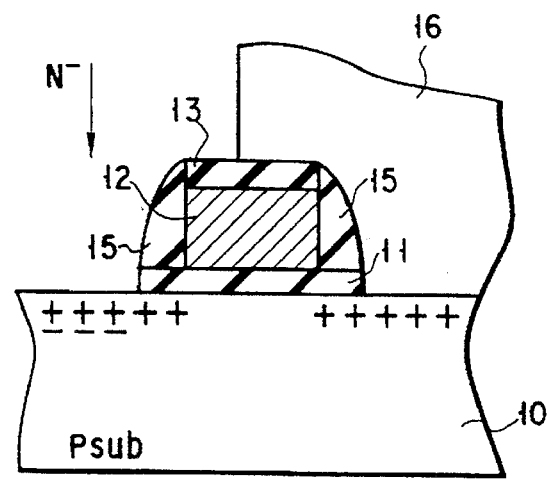
Figure 8C:
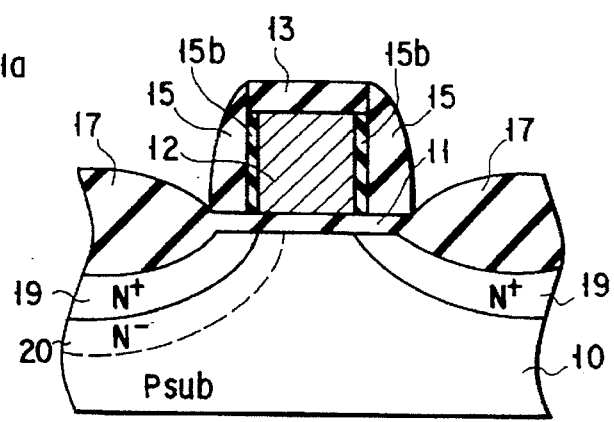

As shown in FIG. 8A, the HTO film 15a is etched in the predetermined regions, where the source and drain regions of the semiconductor substrate 10 are formed, to separate these predetermined regions from the edges of the floating gate 12 by a predetermined distance. Consequently, the spacers 15 having a predetermined shape are formed as the side walls on the two side surfaces of the floating gate 12. In the first embodiment, each spacer 15 has a film thickness of 0.1 μm or more. The thickness of the HTO film 15a and etching for forming a spacer can be variously set in accordance with the conditions of the sequential annealing. As shown in FIG. 8B, after the formation of the spacers 15, the diffusion region on the source side is covered with a photoresist 16 in the photo step. Phosphorus (P) of an $n^-$-type ion as the second impurity species is ion-implanted only in the drain region at an acceleration voltage 30 keV and $5\times10^{14}$ and the second concentration lower than the first predetermined concentration. The diffusion rate of phosphorus (P) as the second impurity species is higher than that of Arsenic (As) as the first impurity species. As shown in FIG. 8C, annealing is performed in an $H_2/O_2$ gas mixture atmosphere at a temperature of 900° to oxidize the source and drain. The $n^+$-type diffusion region 19 and the $n^-$-type diffusion region 20 are formed by the annealing such that phosphorus (P) having a high diffusion rate is diffused below the floating gate 12 more inward than arsenic (As) having a low diffusion rate, and part of the diffusion regions of the first impurity species serves as the tunnel regions which overlap the floating gate 12 via the first insulating film 11. Since phosphorus (P) of an $n^-$-type impurity is diffused from the outside of the spacers 15, a short channel caused by excessive diffusion of phosphorus (P) can be suppressed. By this annealing, the element isolation field oxide films 17 can be formed at a predetermined region of the semiconductor substrate 10. Thereafter, a nitride film 13 on the floating gate 12 is etched and removed in an $H_3PO_4$ liquid at a temperature of 180° C.

Figure 9:
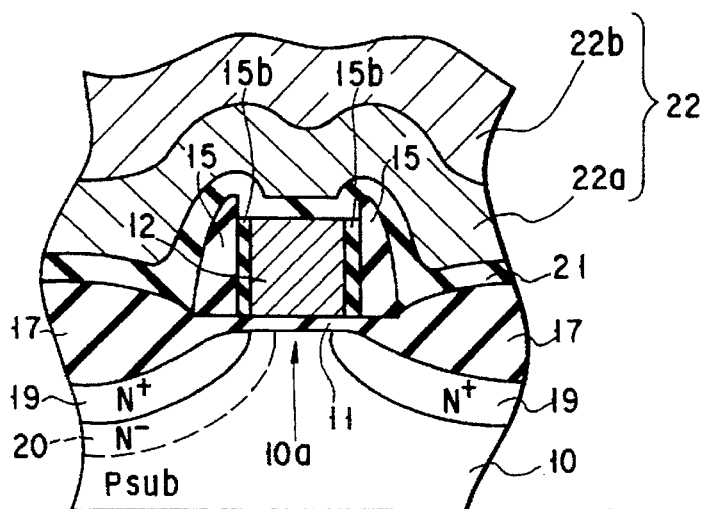
FIG. 9 is a sectional view for explaining the manufacturing process of the floating gate type nonvolatile semiconductor memory cell according to the first embodiment of the present invention.

As shown in FIG. 9, an HTO film, an SiN film, and HTO film are stacked respectively to thicknesses of 5 nm, 8 nm, and 7 nm to form the ONO film 21 as the second insulating film on the entire surface. Thereafter, a second polysilicon film 22a is deposited on the entire surface of the ONO film 21. $POCl_3$ is doped in the resultant structure at a temperature of 875° C. Then, a tungsten silicide (WSi$_x$) film 22b is deposited to 200 nm. The WSi$_x$ film 22b, the polysilicon film 22a, the ONO film 21 and polysilicon film 12 are etched to form the memory cell. That is, the cell is formed by etching the WSi$_x$ film 22b, the polysilicon film 22a, and the ONO film 21 by RIE respectively using an SF$_6$/HBr gas, an HBr/Cl$_2$ gas mixture, and a CHF$_3$ gas. Thereafter, a passivation film (not shown) or the like is formed.

Formation of the diffusion regions in the semiconductor substrate of the memory cell according to the present invention will be described in more detail. As described above, in the present invention, after the floating gate 12 of the polysilicon film is formed by etching, arsenic (As) is doped to form the n$^+$-type diffusion regions 19 using the floating gate 12 as a mask. That is, arsenic (As) is used to form the n$^+$-type diffusion regions 19 serving as tunnel windows for making a tunnel current flow between the floating gate 12 and the diffusion regions via the tunnel oxide film 11a. Therefore, the n$^+$-type diffusion region 19 serving as tunnel window which overlaps the floating gate 12 must have a high concentration so as not to be depleted due to a voltage applied across the floating gate and the drain diffusion region. More specifically, the surface of the tunnel window, i.e., the substrate surface of the n$^+$-type diffusion region 19 must have an impurity concentration of $10^{19}$ to $10^{21}$ cm$^{-3}$ (limit of solid solution). In this case, the impurity concentration of the n$^-$-type diffusion region 20 can be set lower than $5\times10^{19}$ cm$^{-3}$. It is preferable that the n$^+$-type diffusion region 19 having an impurity concentration of $10^{20}$ to $10^{21}$ cm$^{-3}$ overlap the floating gate 12. In this case, the impurity concentration of the n$^-$-type diffusion region 20 may be set lower than $5\times10^{18}$ cm$^{-3}$. In the conventional LDD formation method, since an n$^+$-type diffusion region is diffused from a region corresponding to the outside of a spacer to a region corresponding to the floating gate 12, the impurity concentration decreases to $10^{18}$ to $10^{19}$ cm$^{-3}$ at portions corresponding to the edges of the floating gate. For this reason, the n$^+$-type diffusion region is easily depleted due to a voltage applied across the floating gate and a diffusion region to greatly decrease an F-N tunnel current. In contrast, in the present invention, since n$^+$-type ions of arsenic (As) start to diffuse from portions corresponding to the gate edges to the channel region 10a, the n$^+$-type diffusion region can be formed without decreasing the impurity concentration at the edge of the floating gate 12.

In the present invention, n$^-$-type ions of phosphorus (P) are introduced after the formation of the spacers 15. When n$^+$-type impurities of arsenic (As) for forming the tunnel windows 19a start to diffuse from a portions corresponding to the gate edges to the channel region 10a, n$^-$-type impurities of phosphorus (P) for suppressing an band to band tunnel current start to diffuse from portions corresponding to the spacer edges. Phosphorus (P) has a diffusion rate higher than that of arsenic (As). Therefore, under properly selected conditions, n$^-$-type impurities of phosphorus (P) pass n$^+$-type impurities of arsenic (As) for forming the tunnel windows 19a to form the diffusion regions having the inclined junctions. The n$^-$-type diffusion region containing phosphorus (P) of n$^-$-impurities lowers the steep concentration gradient of arsenic (As) of n$^+$-type impurity at the junction portion. For example, when the first insulating film 11 has a thickness of 5 nm to 30 nm, and a potential difference V$_{GD}$ is about 12 V, the n$^-$-type diffusion region lowers the concentration gradient of arsenic (As) having a concentration of $10^{18}$ to $5\times10^{19}$ cm$^{-3}$, at which an band to band tunnel current is maximized, and suppresses the band to band tunnel current by depleting itself due to an applied voltage. Therefore, the impurity concentration of the n$^-$-type diffusion region at the edge must be lower than $10^{18}$ to $5\times10^{19}$ cm$^{-3}$.

Note that such a DDD structure can be formed not only in the drain region but also in both the source and drain regions or in the source region. The DDD structure can be properly used in accordance with the operation conditions of a memory cell to be used. This is not limited to the first embodiment and can similarly apply to other embodiments.

According to the first embodiment, the nonvolatile memory diffusion layers in which the tunnel windows are ensured, and an inter-band tunnel current and a short channel can be suppressed can be formed by a simple method.

Second Embodiment

FIGS. 10A to 10C and FIGS. 11A to 11D are sectional views for explaining the manufacturing process of a floating gate type nonvolatile semiconductor memory cell according to the second embodiment of the present invention. The second embodiment exemplifies a case using a solid phase diffusion source as an impurity source, instead of impurity ion implantation for forming source and drain regions. That is, after arsenic (As) ions are doped in a semiconductor substrate, phosphorus (P) ions are doped by diffusion from the solid phase diffusion source into a region separated from a gate region of a polysilicon film. As a method of forming a DDD structure, a spacer is used for this solid phase diffusion source in implanting ions.

Figure 10A:
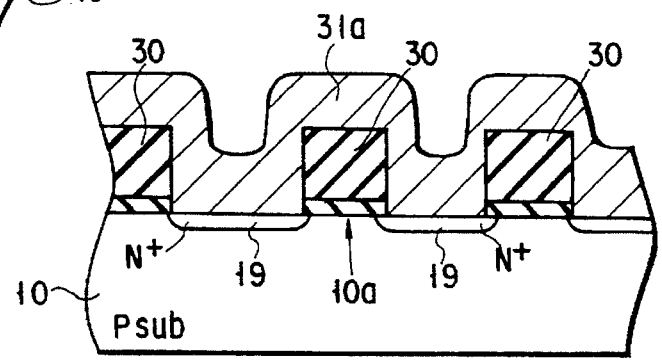
FIGS. 10A to 10C are sectional views for explaining the manufacturing process of a floating gate type nonvolatile semiconductor memory cell according to the second embodiment of the present invention.
Figure 10B:
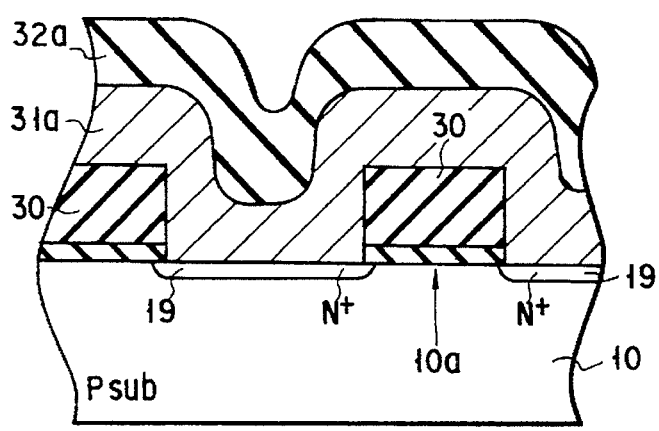
Figure 10C:
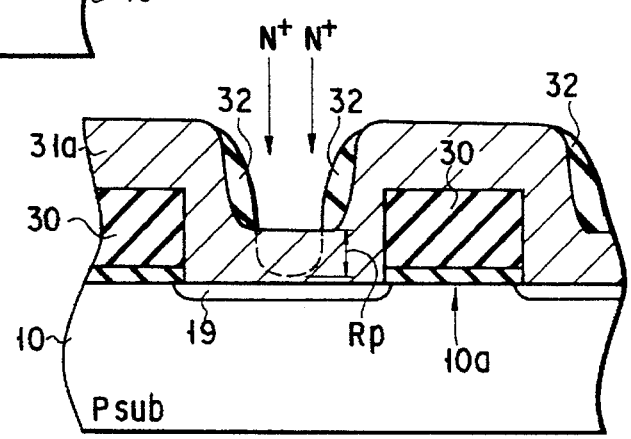

A method of manufacturing the floating gate type nonvolatile semiconductor memory cell according to the second embodiment of the present invention will be described with reference to FIGS. 10A to 10C and FIGS. 11A to 11D. First, as shown in FIG. 10A, a thick oxide film is formed on the surface of a p-type semiconductor substrate 10. Oxide film regions 30 are formed in floating gate formation regions on the semiconductor substrate 10 in the photo step. A first polysilicon film 31a having a predetermined thickness used as a solid phase diffusion source is formed on the entire surface. Thereafter, the first impurity species of the second conductivity type having a predetermined diffusion rate, i.e., arsenic (As) of an n$^+$-type impurity is ion-implanted, at a predetermined concentration, into the first polysilicon film 31a within predetermined regions where source and drain regions of the semiconductor substrate 10 are to be formed. Next, the first annealing is performed to diffuse arsenic (As) of an n$^+$-type impurity doped in the first polysilicon film 31a from the polysilicon film 31a to the semiconductor substrate 10. At this time, arsenic (As) of an n$^+$-type ion is diffused into a region below the oxide film regions 30 so as to allow part of the n$^+$-type diffusion regions to overlap the oxide film regions 30. As shown in FIG. 10B, an HTO film 32a as the second insulating film is deposited on the first polysilicon film 31a. Then, as shown in FIG. 10C, the HTO film 32a is etched by RIE to form spacers 32 having a predetermined shape on the side surfaces of the first polysilicon film 31a within the source and drain regions. The second impurity species of the second conductivity type having a diffusion rate higher than that of arsenic (As) of an n$^+$-type impurity, i.e., phosphorus (P) of an n$^-$-type impurity is implanted to a predetermined depth, at the second concentration lower than the first concentration, in the first polysilicon film 31a within the predetermined regions where the source and drain regions of the semiconductor substrate 10 are to be formed. Phosphorus (P) of an n$^-$-type impurity is doped to the predetermined depth in the first polysilicon film 31a between the spacers 32 within the predetermined regions where the source and drain regions are to be formed. At this time, phosphorus (P) ions must be implanted in narrow regions which contact the semiconductor substrate 10 and are sandwiched between the corresponding spacers 32. Since the first polysilicon film 31a on the thick oxide film regions 30 is removed by sequential etching back, phosphorus (P) is ion-implanted such that at least a distance $R_p$ to the center of the implantation depth does not exceed the thickness of the first polysilicon film 31a. In the case of low implantation energy of phosphorus (P), the spacers 32 which limit the diffusion regions are not required.

Figure 11A:
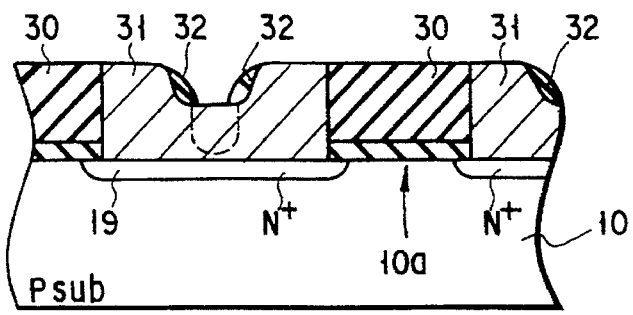
FIGS. 11A to 11D are sectional views for explaining the manufacturing process of the floating gate type nonvolatile semiconductor memory cell according to the second embodiment of the present invention.
Figure 11B:
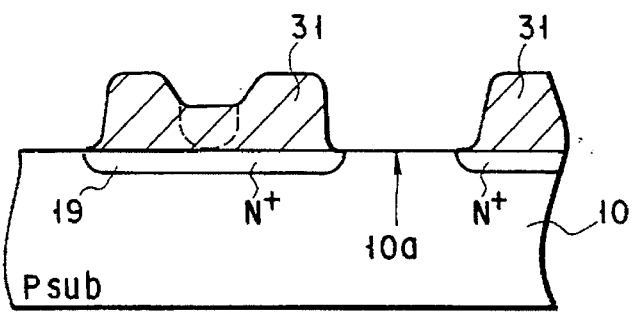
Figure 11C:
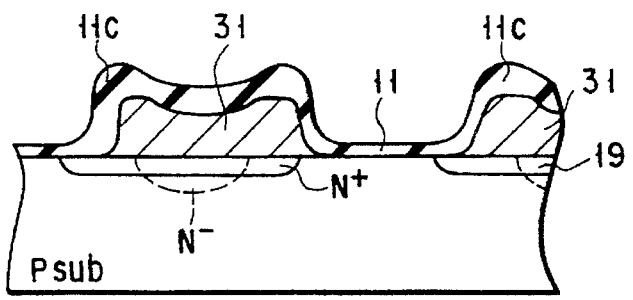
Figure 11D:
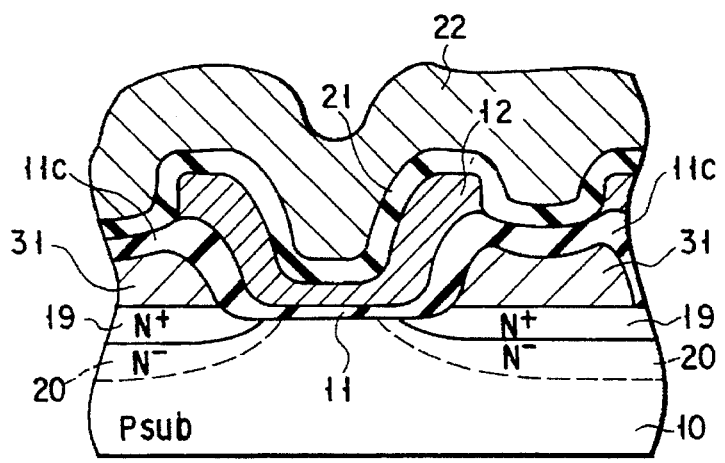

As shown in FIG. 11A, the first polysilicon film 31a on the thick oxide film regions 30 is removed by etching back, and parts of the spacers 32 are removed at the same time. Then, as shown in FIG. 11B, the oxide film regions 30 and the spacers 32 are removed by etching, and only a first polysilicon film 31 remains. As shown in FIG. 11C, the second annealing is performed to form a thick field oxide film 11c on the first polysilicon film 31 in the source and drain regions by using a difference between the oxidation speed of the polysilicon film and that of the semiconductor substrate. At the same time, a tunnel oxide film 11 having a tunnel effect is formed on each channel region 10a of the semiconductor substrate 10. By the second annealing, phosphorus (P) doped in the first polysilicon film 31 are diffused into the semiconductor substrate 10, and arsenic (As) in $n^+$-type diffusion regions 19 are further diffused. As a result, phosphorus (P) having a high diffusion rate is diffused in the semiconductor substrate 10 below the floating gate 12 formation regions more inward than arsenic (As) having a low diffusion rate to form the $n^+$-type diffusion regions 19 and the $n^-$-type diffusion regions 20, which constitute the inclined junctions. Next, as shown in FIG. 11D, in order to form the floating gate 12, the second polysilicon film is deposited on the entire surface. The obtained structure is etched to form the floating gate 12 in the floating gate formation region of the semiconductor substrate 10 and a predetermined region of a field oxide film 11c. Then, the second insulating film, i.e., an ONO film 21 is formed on the entire surface, and the third polysilicon film is further formed on the entire surface. The ONO film 21 and the third polysilicon film are simultaneously etched to form a control gate electrode 22 with the third polysilicon film.

According to the second embodiment, arsenic (As) as an $n^+$-type impurity and phosphorus (P) as an $n^-$-type impurity are doped from the solid phase diffusion source into the semiconductor substrate. By using a difference between the diffusion rate of arsenic (As) and that of phosphorus (P) in annealing, the DDD structure is formed. For this reason, damage to crystal caused by ion implantation is reduced to form the diffusion regions.

Third Embodiment

Figure 12A:
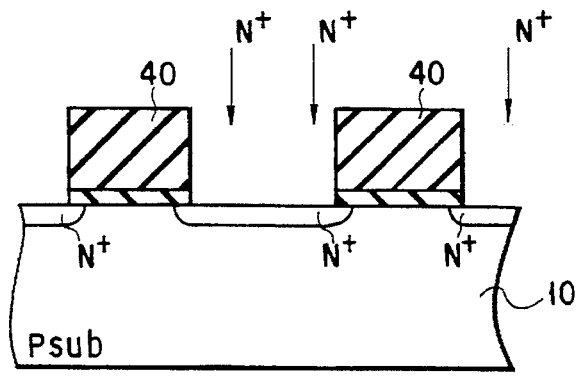
FIGS. 12A to 12C are sectional views for explaining the manufacturing process of a floating gate type nonvolatile semiconductor memory cell according to the third embodiment of the present invention.
Figure 12B:
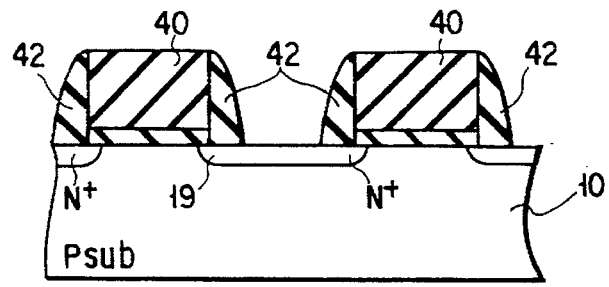
Figure 12C:
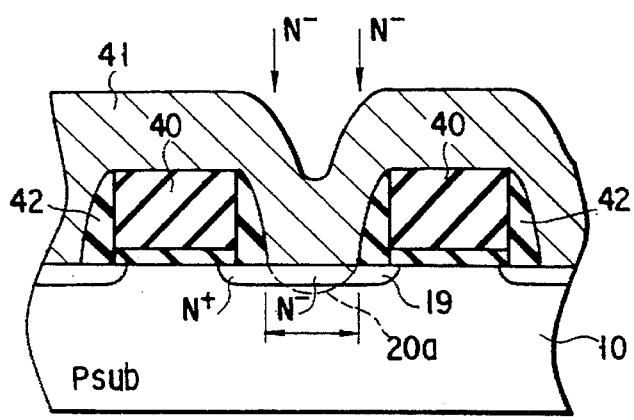

FIGS. 12A to 12C are sectional views for explaining the manufacturing process of a floating gate type nonvolatile semiconductor memory cell according to the third embodiment of the present invention. In the third embodiment, the step of depositing a polysilicon film and the step of forming spacers in the second embodiment are replaced with each other. The third embodiment also exemplifies spacers used to dope phosphorus (P) into a region away from a gate region of a polysilicon film after arsenic (As) is doped into the source and drain regions of a semiconductor substrate.

A method of manufacturing the floating gate type nonvolatile semiconductor memory cell according to the third embodiment of the present invention will be described with reference to FIGS. 12A to 12C. Only a difference from the second embodiment will be described. As shown in FIG. 12A, like the second embodiment, after oxide film regions 40 are formed, arsenic (As) as an $n^+$-type impurity is diffused to form $n^+$-type diffusion regions. Then, as shown in FIG. 12B, an HTO film is deposited and etched to form spacers 42. As shown in FIG. 12C, a polysilicon film 41 is deposited, and the obtained structure is doped with phosphorus (P) as an $n^-$-type impurity. Phosphorus (P) as an $n^-$-type impurity is diffused from the polysilicon film 41 to a semiconductor substrate 10 by annealing. Following the step shown in FIG. 11A of the second embodiment, an $n^+$-type diffusion region 19 and an $n^-$-type diffusion region 20 are formed by using a difference between the diffusion rate of phosphorus (P) and that of arsenic (As), realizing a DDD structure. That is, in the third embodiment, since the diffusion region for phosphorus (P) of an $n^-$-type ion is limited by the spacers 42, the implantation region for phosphorus (P) of an $n^-$-type ion on the polysilicon film 41 is not limited.

According to the third embodiment, damage to crystal caused by ion implantation is reduced to form the diffusion region in the semiconductor substrate.

Fourth Embodiment

Figure 13A:
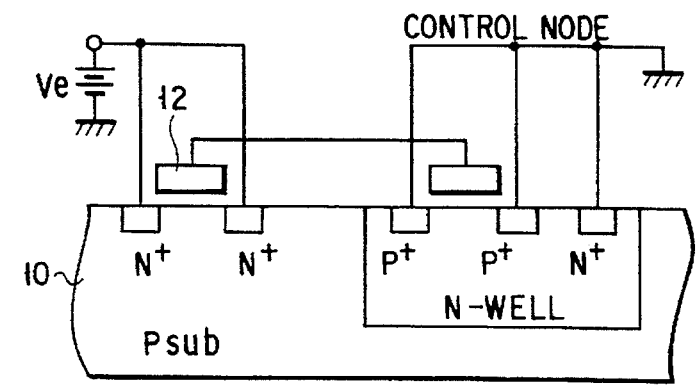
FIGS. 13A to 13D are sectional views for explaining the manufacturing process of a floating gate type nonvolatile semiconductor memory cell according to the fourth embodiment of the present invention.
Figure 13B:
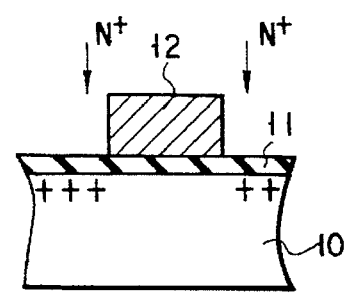
Figure 13C:
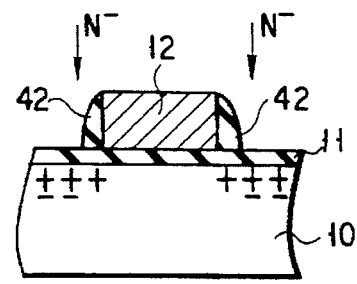

FIGS. 13A to 13C are sectional views for explaining the manufacturing process of a floating gate type nonvolatile semiconductor memory cell according to the fourth embodiment of the present invention. The fourth embodiment exemplifies a floating gate 12 portion of 1-poly type EEPROM, as shown in FIG. 13A. This embodiment shows, for example, a floating gate portion 12 (NMOS) of an EEPROM cell, which was introduced in the VLSI Symposium in 1993 (1993, VLSI Symposium 5A-2). In FIG. 13A, an n-type well region is formed in a p-type semiconductor substrate 10, and $p^+$-type diffusion regions and an $n^+$-type diffusion region are formed in the n-type well. $N^+$-type diffusion regions are formed in the p-type semiconductor substrate 10. An insulating film (not shown) having a tunnel effect is formed on the surface of the semiconductor substrate 10, and a polysilicon film is formed on the insulating film. This polysilicon film is etched to form the floating gate 12 on the semiconductor substrate 10 and the gate of a p-type channel transistor in the n-type well, which are respectively electrically connected. The n-type well and the p-type channel transistor act as control gates. The floating gate 12 extracts electrical charges via an F-N tunnel. In this case, the DDD structure is suitable for avoiding an band to band tunnel. Therefore, a manufacturing method of the present invention to be described below can advantageously ensure a tunnel region.

Figure 13D:
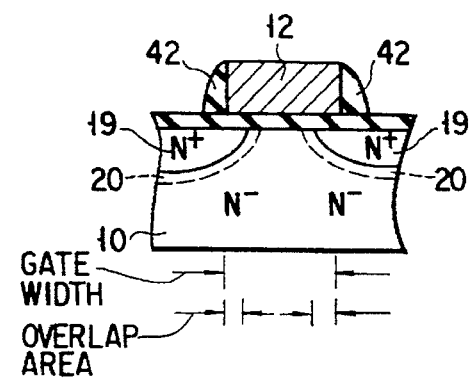

A method of manufacturing the floating gate type nonvolatile semiconductor memory cell according to the fourth embodiment of the present invention will be described with reference to FIGS. 13A to 13D. First, as shown in FIG. 13B, the first impurity species of the second conductivity type having a low diffusion rate, i.e., arsenic (As) ions as $n^+$-type impurities are implanted, by self-alignment using the floating gate 12 as a mask at the fist concentration, in predetermined regions where the source and drain regions of a semiconductor substrate 10 are to be formed. As shown in FIG. 13C, a high temperature oxide (HTO) film is formed on the entire surface. The HTO film is etched to separate this predetermined regions from the edges of the floating gate 12 by a predetermined distance. Consequently, spacers 42 having a predetermined shape are formed on the two side surface of the floating gate 12. Each spacer 42 is formed as a side wall having a thickness of 0.1 μm or more. Thereafter, the second impurity species of the second conductivity type having a diffusion rate higher than that of arsenic (As) ions, i.e., phosphorus (P) ions are implanted, at the second concentration lower than the first predetermined concentration, in the predetermined regions of the semiconductor substrate 10, where the source and drain regions of the semiconductor substrate 10 are to be formed, from portions separated from portions corresponding to the edges of the floating gate 12 by a predetermined distance with the spacers 42. As shown in FIG. 13D, annealing is performed to diffuse phosphorus (P) ions having a high diffusion rate in the channel region below the floating gate 12 more inward than arsenic (As) ions having a low diffusion rate, thereby forming $n^-$-type diffusion regions 20. In addition, $n^+$-type diffusion regions 19 are formed such that parts of the $n^+$-type diffusion regions 19 form tunnel regions overlapping the width of the floating gate 12 via the tunnel oxide film 11.

According to the fourth embodiment, since phosphorus (P) having a high diffusion rate is doped from positions away from the floating gate into the semiconductor substrate, the obtained memory cell can be used for suppressing a short channel in a normal DDD transistor. Even if ion implantation of a memory and that of a logical circuit are simultaneously performed in forming a 1-poly type EEPROM integrated with the logical circuit, this process has an advantage to both the memory portion and the logical circuit portion.

Fifth Embodiment

Figure 14A:
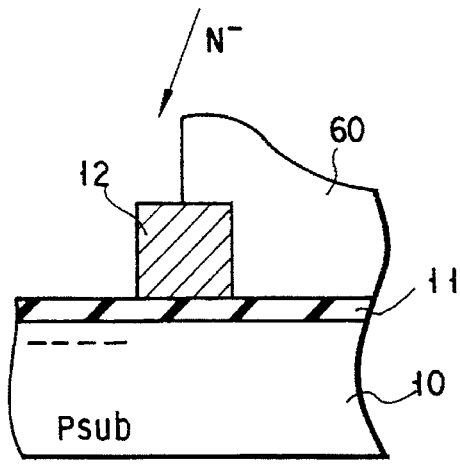
FIGS. 14A and 14B are sectional views for explaining the manufacturing process of a floating gate type nonvolatile semiconductor memory cell according to the fifth embodiment of the present invention.
Figure 14B:
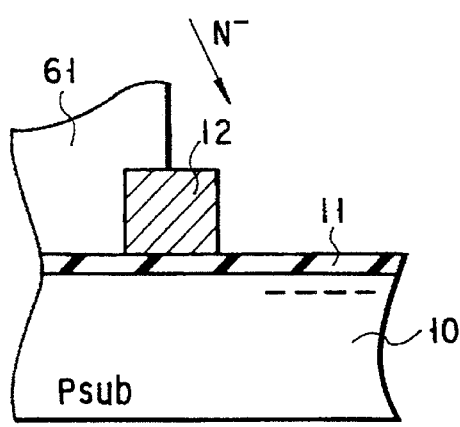

FIGS. 14A and 14B are sectional views for explaining the manufacturing process of a floating gate type nonvolatile semiconductor memory cell according to the fifth embodiment of the present invention. In the fifth embodiment, a method of doping the second species of the second conductivity type from a position away from a floating gate into a semiconductor substrate includes a method of obliquely implanting ions, as shown in FIGS. 14A and 14B. An insulating film 11 having a tunnel effect is formed on the entire surface of a semiconductor substrate 10. A polysilicon film formed on the insulating film 11 is etched to form a floating gate 12 on the channel region of the semiconductor substrate 10. Thereafter, a photoresist is patterned in the photo step to cover either the drain region or the source region. In FIG. 14A, the second impurity species of the second conductivity type, i.e., phosphorus (P) of an $n^-$-type ion is obliquely implanted from a position away from the floating gate 12 independently into the source and drain regions at an angle of 20° or more with respect to the normal on the surface using the floating gate 12 and a photoresist 60 as masks in FIG. 14A or the floating gate 12 and a photoresist 61 as masks in FIG. 14B.

According to the fifth embodiment, since no spacer is required, the manufacturing process for forming the diffusion region in the semiconductor substrate can be simplified.

Sixth Embodiment

Figure 15A:
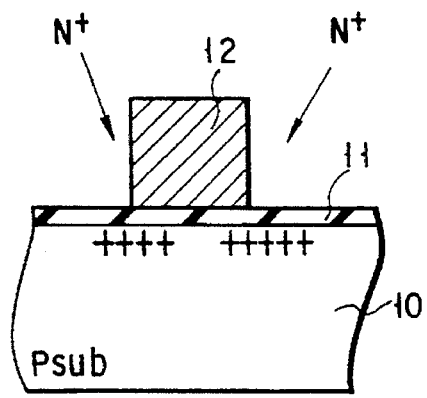
FIGS. 15A to 15C are sectional views for explaining the manufacturing process of a floating gate type nonvolatile semiconductor memory cell according to the sixth embodiment of the present invention.
Figure 15B:
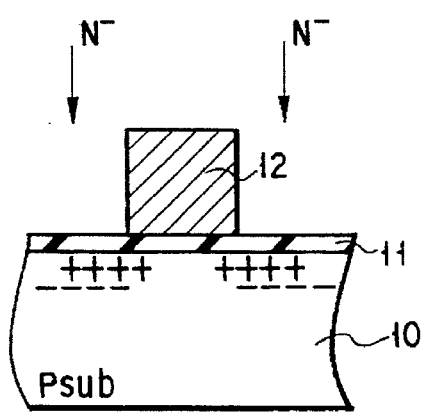
Figure 15C:
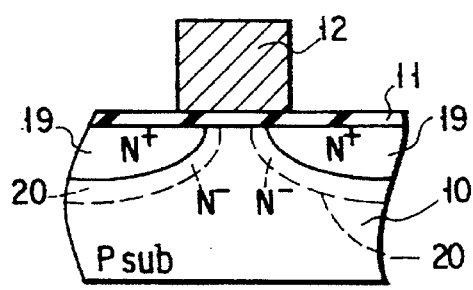

FIGS. 15A to 15C are sectional views for explaining the manufacturing process of a floating gate type nonvolatile semiconductor memory cell according to the sixth embodiment of the present invention. In the sixth embodiment, the first impurity of the second conductivity type, i.e., arsenic ions as $n^+$-type ions are obliquely implanted below a floating gate 12 at an angle of 20° or more with respect to the normal on the surface using only the floating gate 12 as a mask without using a photoresist as a mask. That is, in the sixth embodiment, arsenic (As) as an $n^+$-type ion is obliquely implanted independently into the source and drain regions so as to extend into a region below the floating gate 12, as shown in FIG. 15A. Next, as shown in FIG. 15B, the second impurity species of the second conductivity type, i.e., phosphorus (P) of an $n^-$-type ion is implanted immediately below the gate edges by self-alignment using the floating gate 12 as a mask. Thereafter, as shown in FIG. 15C, $n^+$-type diffusion regions 19 and $n^-$-type diffusion regions 20 are formed by annealing to realize a DDD structure. In the sixth embodiment, the width of the floating gate 12 is determined so as to ensure a channel length taking it into consideration that arsenic (As) as an $n^+$-type ion extends into the region below the floating gate 12.

According to the sixth embodiment, since no spacer is required to be formed, and no photoresist is used as a mask, the manufacturing process of forming the diffusion region in the semiconductor substrate can be further simplified.

Seventh Embodiment

Figure 16A:
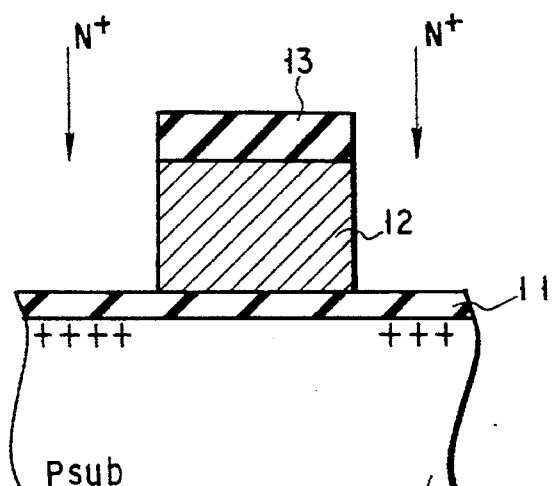
FIGS. 16A and 16B are sectional views for explaining the manufacturing process of a floating gate type nonvolatile semiconductor memory cell according to the seventh embodiment of the present invention.
Figure 17A:
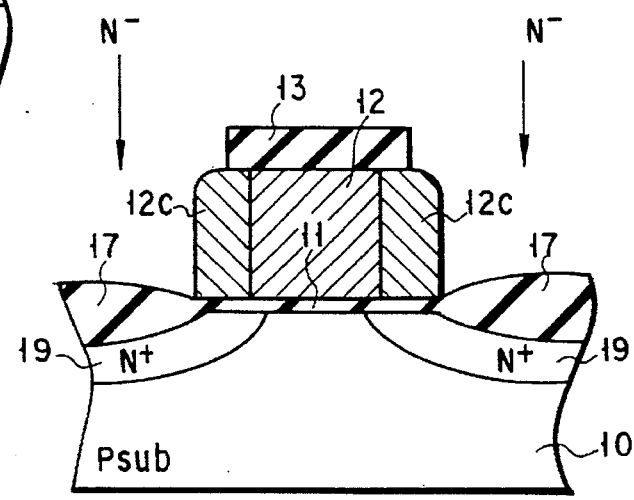
FIGS. 17A and 17B are sectional views for explaining the manufacturing process of the floating gate type nonvolatile semiconductor memory cell according to the seventh embodiment of the present invention.
Figure 16B:
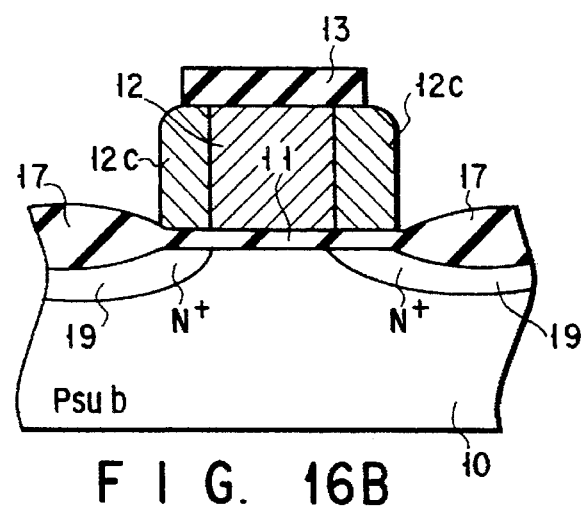
Figure 17B:
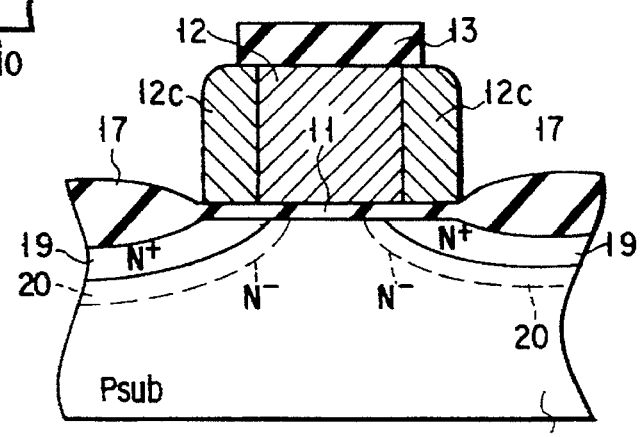

FIGS. 16A and 16B and FIGS. 17A and 17B are sectional views for explaining the manufacturing process of a floating gate type nonvolatile semiconductor memory cell according to the seventh embodiment of the present invention. With reference to FIGS. 16A and 16B and FIGS. 17A and 17B, a method of manufacturing the floating gate type nonvolatile semiconductor memory cell according to the seventh embodiment of the present invention will be described. First, as shown in FIG. 16A, a first insulating film 11 having a tunnel effect is formed on the surface of a p-type semiconductor substrate 10. The first polysilicon film is formed on the first insulating film 11. After the formation of the first polysilicon film, a nitride (SiN) film for protecting the surface of a floating gate is formed on the entire surface. The nitride film and the first polysilicon film are etched to form a nitride film region 13 and a floating gate 12 on the channel region of the semiconductor substrate 10. The first impurity species of the second conductivity type having a predetermined diffusion rate, i.e., arsenic (As) as an $n^+$-type impurity is implanted, by self-alignment using the nitride film region 13 and the floating gate 12 as a mask at the first concentration, into predetermined regions of the semiconductor substrate 10 where the source and drain regions of the semiconductor substrate 10 are to be formed. As shown in FIG. 16B, the first annealing is performed, and parts of $n^+$-type diffusion regions 19, which are formed by diffusing arsenic (As) as an $n^+$-type impurity below the floating gate 12, overlap the floating gate 12 via the first insulating film 11 to form tunnel regions. In addition, side oxide films 12c having a predetermined thickness are formed on the two side surfaces of the floating gate 12. That is, by annealing and oxidation processes, arsenic (As) is driven into a region below the floating gate 12, and the polysilicon side oxide films 12c are formed. The width of the floating gate 12 is designed taking the formation of the side oxide films 12c on its side surfaces into consideration. By the first annealing, element isolation field oxide films 17 are formed in predetermined regions of the semiconductor substrate 10. Then, as shown in FIG. 17A, the second impurity species of the second conductivity type having a diffusion rate higher than that of the first impurity species, i.e., phosphorus (P) as an $n^-$-type ion is implanted, via the element isolation field oxide films 17 by self-alignment using the floating gate 12 and the side oxide films 12c as masks at the second concentration lower than the first concentration, into the predetermined regions of the semiconductor substrate 10 where the source and drain regions of the semiconductor substrate 10 are to be formed. As shown in FIG. 17B, the second annealing is performed to diffuse phosphorus (P) having a high diffusion rate below the floating gate 12 more inward than arsenic (As) having a low diffusion rate, thereby forming $n^-$-type diffusion regions 20. By the second annealing, the element isolation field oxide films 17 are formed to have a predetermined thickness. Subsequently, the SiN film 13 is removed, the second insulating film (ONO film) is formed on the entire surface, and the second polysilicon film is further formed (not shown). The second insulating film and the second polysilicon film are respectively etched to form a control gate with the polysilicon film. Also in the seventh embodiment, arsenic (As) of an $n^+$-type impurity is ion-implanted upon the formation of the floating gate 12 of the second polysilicon film, and then phosphorus (P) of an $n^-$-type impurity is ion-implanted to form the diffusion regions by annealing.

According to the seventh embodiment, since the side oxide film can be formed only in the oxidation step, the manufacturing process of forming the diffusion regions in the semiconductor substrate can be simplified in comparison with the first to fourth embodiments in which an HTO film is deposited and etched to form spacers.

In the above embodiments, arsenic (As) is used as an $n^+$-type impurity. The present invention can use antimony (Sb) instead of arsenic (As).

As has been described above, according to the present invention, a short channel effect caused by diffusion of phosphorus (P) can be prevented because phosphorus (P) having a high diffusion rate are implanted from a position away from a portion corresponding to the edges of a polysilicon floating gate after formation of spacers. An F-N tunnel current path to the floating gate can be ensured by a diffusion region of arsenic (As) ions implanted in the edges of the floating gate. Further, a band to band current can be suppressed with a DDD structure. Moreover, a nonvolatile memory cell can be very easily realized.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of forming a diffusion layer, comprising the steps of:

forming an insulating film having a tunnel effect on a surface of a semiconductor substrate of a first conductivity type;

forming a polysilicon film on said insulating film;

etching said polysilicon film to form a floating gate on a channel region of said semiconductor substrate;

implanting a first impurity species of a second conductivity type having a diffusion rate at a first concentration at a first position, adjacent to said floating gate, of said semiconductor substrate in regions where source and drain regions of said semiconductor substrate are to be formed;

implanting a second impurity species of the second conductivity type having a diffusion rate higher than the diffusion rate of said first species at a second concentration lower than the first concentration at a second position, separated from said first position by a distance, of said semiconductor substrate in said regions where said source and drain regions of said semiconductor substrate are to be formed; and forming a diffusion region of the second conductivity type by annealing such that said second impurity species having the high diffusion rate is diffused below said floating gate more inward than said first impurity species having the low diffusion rate, and part of said diffusion region formed by said first impurity species serves as a tunnel region which overlaps said floating gate via said first insulating film.

2. A method of manufacturing a nonvolatile semiconductor memory device, comprising the steps of:

forming a first insulating film having a tunnel effect on a surface of a semiconductor substrate of a first conductivity type;

forming a first polysilicon film on said first insulating film;

etching said first polysilicon film to form a floating gate on a channel region of said semiconductor substrate;

implanting, at a first concentration, a first impurity species of a second conductivity type having a diffusion rate into said semiconductor substrate in regions where source and drain regions of said semiconductor substrate are to be formed, in contact with a portion corresponding to an edge of said floating gate;

implanting, at a second concentration lower than the first concentration, a second impurity species of the second conductivity type having a diffusion rate higher than the diffusion rate of said first species into said semiconductor substrate in said regions where said source and drain regions of said semiconductor substrate are to be formed, separated from said portion corresponding to said edge of said floating gate by a distance;

forming a diffusion region of the second conductivity type by annealing such that said second impurity species having the high diffusion rate is diffused below said floating gate more inward than said first impurity species having the low diffusion rate, and part of said diffusion region formed by said first impurity species serves as a tunnel region which overlaps said floating gate via said first insulating film;

forming a second insulating film on an entire surface;

forming a second polysilicon film on a surface of said second insulating film; and etching said second insulating film and said first and second polysilicon film to form a nonvolatile memory cell.

3. A method of manufacturing a nonvolatile semiconductor memory device, comprising the steps of:

forming a first insulating film having a tunnel effect on a surface of a semiconductor substrate of a first conductivity type;

forming a first polysilicon film on said first insulating film;

etching said first polysilicon film to form a floating gate on a channel region of said semiconductor substrate;

implanting, by self-alignment using said floating gate as a mask at a first concentration, a first impurity species of a second conductivity type having a diffusion rate into said semiconductor substrate in regions where source and drain regions of said semiconductor substrate are to be formed;

implanting, at a second concentration lower than the first concentration, a second impurity species of the second conductivity type having a diffusion rate higher than the diffusion rate of said first species into said semiconductor substrate in said regions where said source and drain regions of said semiconductor substrate are to be formed, separated from a portion corresponding to an edge of said floating gate by a distance;

forming a diffusion region of the second conductivity type by annealing such that said second impurity species having the high diffusion rate is diffused below said floating gate more inward than said first impurity species having the low diffusion rate, and part of said diffusion region formed by said first impurity species serves as a tunnel region which overlaps said floating gate via said first insulating film;

forming a second insulating film on an entire surface;

forming a second polysilicon film on a surface of said second insulating film; and etching said second insulating film and said first and second polysilicon films to form a nonvolatile memory cell.

4. A method of manufacturing a nonvolatile semiconductor memory device, comprising the steps of:

forming an insulating film having a tunnel effect on a surface of a semiconductor substrate of a first conductivity type;

forming a polysilicon film on said insulating film;

etching said polysilicon film to form a floating gate on a channel region of said semiconductor substrate and a control gate on a coupling region of said semiconductor substrate such that said floating gate and said control gate are electrically connected;

implanting, by self-alignment using said floating gate and said control gate as masks at a first concentration, a first impurity species of a second conductivity type having a diffusion rate into said semiconductor substrate in regions where source and drain regions of said semiconductor substrate are to be formed;

implanting, at a second concentration lower than the first concentration, a second impurity species of the second conductivity type having a diffusion rate higher than the diffusion rate of said first species into said semiconductor substrate in said regions where said source and drain regions of said semiconductor substrate are to be formed, separated from a portion corresponding to an edge of said floating gate by a distance; and forming a diffusion region of the second conductivity type by annealing such that said second impurity species having the high diffusion rate is diffused below said floating gate more inward than said first impurity species having the low diffusion rate, and part of said diffusion region formed by said first impurity species serves as a tunnel region which overlaps said floating gate via said insulating film.

5. A method of manufacturing a nonvolatile semiconductor memory device, comprising the steps of:

forming an oxide film on a surface of a semiconductor substrate of a first conductivity type;

etching said oxide film to form an oxide film region in a floating gate formation region on a channel region of said semiconductor substrate;

forming a first polysilicon film having a thickness on an entire surface including source and drain regions and said oxide film region of said semiconductor substrate;

implanting, at a first concentration, a first impurity species of a second conductivity type having a diffusion rate into said first polysilicon film to form the regions to be said source and drain regions which are separated from each other by a first distance in said semiconductor substrate;

performing a first annealing such that said first impurity species of the second conductivity type is diffused from said first polysilicon film into said source and drain regions, and part of a first diffusion region formed by said first impurity species overlaps said oxide film region;

implanting, at a second concentration lower than the first concentration, a second impurity species of the second conductivity type having a diffusion rate higher than the diffusion rate of said first impurity species into said first polysilicon film to be the regions where said source and drain regions which are separated from each other by a second distance larger than the first distance in said semiconductor substrate;

etching back said first polysilicon film to expose a surface of said oxide film region;

removing said oxide film region by etching;

performing a second annealing such that a device isolation field oxide film is formed on said first polysilicon film in said source and drain regions, at the same time a first insulating film having a tunnel effect is formed on said semiconductor substrate, and said second impurity species having the high diffusion rate is diffused in said semiconductor substrate below said floating gate formation region more inward than said first impurity species having the low diffusion rate;

forming a second polysilicon film on an entire surface;

etching said second polysilicon film to form a floating gate in said channel region of said semiconductor substrate and a region of said field oxide film;

forming a second insulating film on an entire surface;

forming a third polysilicon film on a surface of said second insulating film; and etching said second insulating film and said first, second and third polysilicon films to form a nonvolatile memory cell.

6. A method of manufacturing a nonvolatile semiconductor memory device, comprising the steps of:

forming a first insulating film having a tunnel effect on a surface of a semiconductor substrate of a first conductivity type;

forming a first polysilicon film on said first insulating film;

etching said first polysilicon film to form a floating gate on a channel region of said semiconductor substrate;

implanting, by self-alignment using said floating gate as a mask at a first concentration, a first impurity species of a second conductivity type having a diffusion rate into said semiconductor substrate in regions where source and drain regions of said semiconductor substrate are to be formed;

performing a first annealing such that part of a first diffusion region formed by diffusing said first impurity species of the second conductivity type into a region below said floating gate overlaps said floating gate via said first insulating film to serve as a tunnel region, and a side oxide film having a thickness is formed on a side surface of said floating gate;

implanting, by self-alignment using said floating gate and said side oxide film at a second concentration lower than the first concentration, a second impurity species of the second conductivity type having a diffusion rate higher than the diffusion rate of said first species into said semiconductor substrate in said regions where said source and drain regions of said semiconductor substrate are to be formed;

performing a second annealing such that part of a second diffusion region formed by diffusing said second impurity species having the high diffusion rate more inward than said first impurity species having the low diffusion rate forms an overlapping portion with said floating gate via said first insulating film;

forming a second insulating film on an entire surface;

forming a second polysilicon film on a surface of said second insulating film; and etching said second insulating film and said first and second polysilicon film to form a nonvolatile memory cell.

7. A method of forming a diffusion layer, comprising the steps of:

forming a gate electrode on a main surface of a semiconductor substrate of a first conductivity type via an insulation film;

implanting a first impurity species of a second conductivity type having a first diffusion rate, at a first concentration, into regions of said semiconductor substrate, where a source region and a drain region are formed, with use of said gate electrode as a mask;

implanting a second impurity species of the second conductivity type having a second diffusion rate higher than the first diffusion rate of said first impurity species, at a second concentration lower than the first concentration, into a section of said semiconductor substrate, which is located away from said gate electrode further than said regions; and forming a diffusion region of the second conductivity type by annealing such that said second impurity species is diffused below said gate electrode more inward than said first impurity species.

8. A method of forming a diffusion layer comprising the steps of: forming a gate electrode on a main surface of a semiconductor substrate of a first conductivity type via an insulation film;

implanting a first impurity species of a second conductivity type having a first diffusion rate, at a first concentration, into regions of said semiconductor substrate, where a source region and a drain region are to be formed, with use of said gate electrode as a mask;

forming a side wall for said gate electrode;

implanting a second impurity species of the second conductivity type having a second diffusion rate higher than the first diffusion rate of said first impurity species, at a second concentration lower than the first concentration, into said regions with use of said gate electrode and said side wall as a mask; and forming a diffusion region of the second conductivity type by annealing such that said second impurity species is diffused below said gate electrode more inward than said first impurity species.

9. A method of forming a diffusion layer, comprising the steps of:

forming a gate electrode on a main surface of a semiconductor substrate of a first conductivity type via an insulation film;

implanting a first impurity species of a second conductivity type having a first diffusion rate, at a first concentration, into regions of said semiconductor substrate, where a source region and a drain region are to be formed, with use of said gate electrode as a mask;

implanting a second impurity species of the second conductivity type having a second diffusion rate higher than the first diffusion rate of said first impurity species, at a second concentration lower than the first concentration, into a section of said semiconductor substrate, which is located away from said gate electrode further than said regions, non-vertically to the main surface of said semiconductor substrate; and forming a diffusion region of the second conductivity type by annealing such that said second impurity species is diffused below said gate electrode more inward than said first impurity species.

10. A method of manufacturing a non-volatile semiconductor memory device comprising a floating gate electrode, a second gate insulation film and control gate electrode on a first gate insulation film on a semiconductor substrate said method comprising the steps of:

forming a floating gate electrode, a second gate insulation film and a control gate electrode, on a first gate insulation film on a semiconductor substrate;

implanting a first impurity ion having an opposite conductivity type to that of said semiconductor substrate, using said floating gate electrode as a mask to form source and drain regions;

forming a silicon oxide film on a lateral surface of said floating gate electrode and said second gate insulation film; and implanting a second impurity ion of a higher diffusion rate than said first impurity ion, having an opposite conductivity type to that of said semiconductor substrate into at least one of said source and drain regions, whereby said second impurity ion is caused to be diffused below said floating gate more inward than said first impurity ion.

11. A method of manufacturing a non-volatile semiconductor memory device comprising a floating gate electrode, a second gate insulation film and a control gate electrode on a first gate insulation film on a semiconductor substrate, comprising the steps of:

forming a silicon nitride film on said floating gate;

forming a silicon oxide film on a lateral surface of said floating gate electrode and said silicon nitride film;

implanting a first impurity ion having an opposite conductivity type to that of said semiconductor substrate into at least one of a source side and a drain side; and implanting a second impurity ion of a higher diffusion rate than said first impurity ion, having an opposite conductivity type to that of said semiconductor substrate, using said floating gate electrode, said silicon nitride film and said silicon oxide film as a mask, into said at least one of a source side and a drain side whereby said second impurity ion is caused to be diffused below said floating gate more inward than said first impurity ion.

* * * * *